(12) United States Patent
Choi et al.

(10) Patent No.: US 8,062,978 B2
(45) Date of Patent: Nov. 22, 2011

(54) CRYSTALLINE ALUMINUM OXIDE LAYERS HAVING INCREASED ENERGY BAND GAP, CHARGE TRAP LAYER DEVICES INCLUDING CRYSTALLINE ALUMINUM OXIDE LAYERS, AND METHODS OF MANUFACTURING THE SAME

(75) Inventors: Sang-moo Choi, Yongin-si (KR);
Jung-hun Sung, Yongin-si (KR);
Kwang-soo Seol, Suwon-si (KR);
Woong-chul Shin, Daejeon (KR);
Sang-jin Park, Pyeongtaek-si (KR)

(73) Assignee: Samsung Electronics Co., Inc., Gyeonggi-Do (KR)

( * ) Notice: Subject to any disclaimer, the term of this patent is extended or adjusted under 35 U.S.C. 154(b) by 768 days.

(21) Appl. No.: 12/219,987

(22) Filed: Jul. 31, 2008

(65) Prior Publication Data

US 2009/0071934 A1    Mar. 19, 2009

(30) Foreign Application Priority Data

Aug. 24, 2007   (KR) ........................ 10-2007-0085728
Apr. 28, 2008   (KR) ........................ 10-2008-0039458

(51) Int. Cl.
*H01L 21/44*   (2006.01)
(52) U.S. Cl. ........................................ 438/688; 438/689
(58) Field of Classification Search .................. 438/688, 438/689
See application file for complete search history.

(56) References Cited

U.S. PATENT DOCUMENTS

| 6,355,519 | B1 * | 3/2002 | Lee ............................... 438/250 |
| 6,774,050 | B2 * | 8/2004 | Ahn et al. ..................... 438/769 |
| 6,831,010 | B2 * | 12/2004 | Beekman et al. ............. 438/677 |

* cited by examiner

*Primary Examiner* — Roberts Culbert
(74) *Attorney, Agent, or Firm* — Harness, Dickey & Pierce, P.L.C.

(57) ABSTRACT

Crystalline aluminum oxide layers having increased energy band gap, charge trap memory devices including crystalline aluminum oxide layers and methods of manufacturing the same are provided. A method of forming an aluminum oxide layer having an increased energy band gap includes forming an amorphous aluminum oxide layer on a lower film, introducing hydrogen (H) or hydroxyl group (OH) into the amorphous aluminum oxide layer, and crystallizing the amorphous aluminum oxide layer including the H or OH.

27 Claims, 18 Drawing Sheets

+

THERMAL TREATMENT

+

THERMAL TREATMENT

CRYSTALLINE ALUMINUM OXIDE LAYERS HAVING INCREASED ENERGY BAND GAP, CHARGE TRAP LAYER DEVICES INCLUDING CRYSTALLINE ALUMINUM OXIDE LAYERS, AND METHODS OF MANUFACTURING THE SAME

PRIORITY STATEMENT

This non-provisional U.S. patent application claims priority under 35 U.S.C. §119 to Korean Patent Application No. 10-2007-0085728, filed on Aug. 24, 2007, and Korean Patent Application No. 10-2008-0039458, filed Apr. 28, 2008, in the Korean Intellectual Property Office, the entire contents of each of which are incorporated herein by reference.

BACKGROUND

Description of the Related Art

Related art charge trap flash memory devices (hereinafter, memory devices) may include a metal electrode, a blocking oxide film, a charge trap layer, a tunneling oxide film, and a silicon substrate. Charge retention capacity of these example related art memory devices may be determined by a deep trap energy of the charge trap layer, thickness of the tunneling oxide film, and the electrical characteristics of the blocking oxide film. Electrical characteristics of the blocking oxide film include, for example, dielectric constant, energy band gap, etc.

The energy band gap of the blocking oxide film and the charge retention capacity of the memory device are closely dependent with each other. For example, when the energy band gap of the blocking oxide film is relatively high, a relatively low amount of charges stored in the charge trap layer of the memory device escape to the metal electrode through the blocking oxide film. More generally, as the energy band gap of the blocking oxide film increases, charge leakage from the charge trap layer through the blocking oxide film decreases.

Related art memory devices may utilize an aluminum oxide film as the blocking oxide film. Related art aluminum oxide films have an energy band gap of 6.5 eV and are relatively thermodynamically stable. However, the charge retention capacity of a related aluminum oxide film may not be sufficient for developing next-generation memory devices because as the degree of integration of next-generation memory increases, the thickness of the blocking oxide film may decrease. If the aluminum oxide film is too thin, then the aluminum oxide film may not sufficiently suppress charge leakage from the charge trap layer.

SUMMARY

Example embodiments may provide more stable charge retention capacity and/or a blocking oxide film having a greater energy band gap.

Example embodiments relate to methods of manufacturing memory devices, for example, methods of increasing energy band gaps of amorphous aluminum oxide layers and methods of manufacturing charge trap memory devices using the same.

Example embodiments relate to memory devices, for example, aluminum oxide layers having increased energy band gaps and charge trap memory devices using the same.

Example embodiments provide methods of increasing energy band gaps of crystalline aluminum oxide layers in order to increase a charge blocking capacity of the crystalline aluminum oxide layer used as a charge blocking layer. Example embodiments also provide methods of manufacturing charge trap memory devices having increased and more stable charge retention capacity.

At least one example embodiment provides a method of increasing an energy band gap of an aluminum oxide layer. According to at least this method, an amorphous aluminum oxide layer may be formed on a lower film, and hydrogen (H) or hydroxyl group (OH) may be introduced in the amorphous aluminum oxide layer. The amorphous aluminum oxide layer in which H or OH was introduced may be crystallized.

At least one other example embodiment provides a method of increasing an energy band gap of an aluminum oxide layer. According to at least this example embodiment, an amorphous aluminum oxide layer may be formed on a lower film, and hydrogen (H) or hydroxyl group (OH) may be introduced in the amorphous aluminum oxide layer. Crystallization may be performed on the amorphous aluminum oxide layer in which H or OH was introduced. The amorphous aluminum oxide layer may be formed on a lower film and the H or OH may be introduced in the amorphous aluminum oxide layer in a single process. The single process may be performed to deposit an aluminum oxide layer in an amorphous or crystalline state by using a vapor deposition method or an atomic layer deposition (ALD) method and to introduce H or OH in the aluminum oxide layer. In this example embodiment, the aluminum oxide layer may be an amorphous aluminum oxide layer or a crystalline aluminum oxide layer including H or OH. When the aluminum oxide layer is a crystalline aluminum oxide layer including H or OH, the H or OH may be removed from the crystalline aluminum oxide layer including H or OH using a thermal treatment process.

At least one other example embodiment provides a method of manufacturing a charge trap memory device including a tunneling film, a charge trap layer, a charge blocking layer, and a gate electrode. According to at least this example embodiment, the charge blocking layer may be formed by forming an amorphous aluminum oxide layer on the charge trap layer, introducing H or OH in the amorphous aluminum oxide layer, and crystallizing the amorphous aluminum oxide layer in which H or OH is introduced. The crystallized aluminum oxide layer may include a crystal phase of which an energy band gap is greater than or equal to about 7.0 eV. The H or OH may be introduced using one of a wet oxidation method, an ion implantation method, a plasma doping method or the like.

At least one other example embodiment provides a method of manufacturing a charge trap memory device. At least this example embodiment may include forming, on a charge trap layer, a crystalline aluminum oxide layer having an energy band gap greater than an energy band gap associated with an aluminum oxide layer having a γ-phase crystal structure.

At least one other example embodiment provides an aluminum oxide layer structure having an increased energy band gap. The aluminum oxide layer structure may include a crystalline aluminum oxide layer having an energy band gap greater than an energy band gap associated with an aluminum oxide layer having a γ-phase crystal structure.

At least one other example embodiment provides a charge trap memory device. According to at least this example embodiment, the charge trap memory device may include a gate stack structure formed on a substrate. The gate stack structure may include a tunneling film formed on the substrate, a charge trap layer formed on the tunneling film, an aluminum oxide layer structure formed on the charge trap layer, and a gate electrode formed on a top surface of the crystalline aluminum oxide layer structure. The aluminum oxide layer structure may include a crystalline aluminum oxide layer having an energy band gap greater than an energy band gap associated with an aluminum oxide layer having a γ-phase crystal structure According to at least some example embodiments, when H or OH is introduced in the amorphous aluminum oxide layer, the amorphous aluminum oxide layer may be changed to a crystalline aluminum oxide layer including the H or OH at a temperature more than about 800° C., for example, between about 800° C. and about 850° C., inclusive. In this example, a thermal treatment process may be performed to at least partially remove H or OH from the crystalline aluminum oxide layer.

According to at least some example embodiments, the H or OH may be implanted using one of a wet oxidation method, an ion implantation method, and a plasma doping method. The wet oxidation may be performed at atmospheric pressure and high temperature, or at high pressure and low temperature.

According to at least some example embodiments, after forming the amorphous aluminum oxide layer on a lower film and introducing H or OH in the amorphous aluminum oxide layer, a thermal treatment may be performed on the aluminum oxide layer in a temperature range of between about 800° C. and about 1300° C., inclusive, to crystallize the aluminum oxide layer. In this example, a further thermal treatment may be performed on the amorphous aluminum oxide layer at a temperature lower than a crystallization temperature of the amorphous aluminum oxide layer (e.g., less than or equal to about 800° C.).

According to at least some example embodiments, a densification process may be performed on the amorphous aluminum oxide layer before or after the wet oxidation, and may preferably be performed before the wet oxidation, but before injecting H or OH into the amorphous aluminum oxide layer. The forming of the amorphous aluminum oxide layer on the charge trap layer and the introducing H or OH in the amorphous aluminum oxide layer may be performed in a single process. When H or OH is introduced in the amorphous aluminum oxide layer, the amorphous aluminum oxide layer may be changed to a crystalline aluminum oxide layer including H or OH at a temperature greater than or equal to about 800° C., for example, between about 800° C. and about 850° C., inclusive. In this example, a thermal treatment process may be performed to remove H or OH from the crystalline aluminum oxide layer. The performing of crystallization on the amorphous aluminum oxide layer includes performing a thermal treatment on the aluminum oxide layer in a temperature range of between about 800° C. to and about 1300° C., inclusive.

When the amorphous aluminum oxide layer is formed on the charge trap layer, after the amorphous aluminum oxide layer is formed on the charge trap layer in an oxygen-rich state, H may be introduced.

According to at least some example embodiments, a densification process may be performed as described above. The tunneling film may be a silicon oxide film, a silicon oxynitride film, a silicon nitride film or the like.

According to at least some example embodiments, the charge trap layer may include a plurality of nanodots, or may be a metal-doped high-k oxide, for example, may include a plurality of aluminum oxide dots.

A crystalline aluminum oxide layer used as a charge blocking layer in at least this example embodiment may be formed by a wet oxidation process and/or a thermal treatment process. In these processes, a crystal structure of the crystalline aluminum oxide layer may transition from γ-phase to κ-phase or α-phase. Therefore, according to at least this example embodiment, an energy band gap of the crystalline aluminum oxide layer may be greater than or equal to about 7.0 eV. Accordingly, passage of charges trapped in a charge trap layer through the crystalline aluminum oxide layer to a gate electrode may be suppressed, thereby increasing a charge retention capacity of a memory device.

According to at least some example embodiments, the band gap energy of the crystalline aluminum oxide layer may be greater than or equal to about 7.0 eV. The crystalline aluminum oxide layer may have a κ-phase or α-phase crystal structure. The crystalline aluminum oxide layer may include at least one of hydrogen (H) and hydroxyl group (OH) implanted therein.

According to at least some example embodiments, the forming of the crystalline aluminum oxide layer may include: forming an amorphous aluminum oxide layer on a lower film, implanting at least one of hydrogen (H) and hydroxyl group (OH) into the amorphous aluminum oxide layer, and crystallizing the amorphous aluminum oxide layer including at least one of H and OH. The crystallizing may include: performing a first thermal treatment on the amorphous aluminum oxide layer. The first thermal treatment may be performed in a temperature range of about 800° C. to about 1300° C., inclusive. A second thermal treatment may be performed on the crystalline aluminum oxide layer at a temperature lower than a crystallization temperature of the amorphous aluminum oxide layer. The crystallizing of the amorphous aluminum oxide layer may be performed concurrently with the implanting of at least one of H and OH in the amorphous aluminum oxide layer.

According to at least some example embodiments, a tunneling film may be formed on a substrate, and the charge trap layer may be formed on the tunneling film. A gate electrode may be formed on the top surface of the crystalline aluminum oxide structure. The tunneling film, the charge trap layer, the crystalline aluminum oxide layer and the gate electrode may form a gate stack structure.

According to at least some example embodiments, first and second impurity regions may be formed in the substrate by implanting first conductive impurities in the substrate using the gate stack structure as a first mask. A gate spacer may be formed on each side of the gate stack structure. Second conductive impurities may be implanted into portions of the first and second impurity regions using the gate stack structure and the gate spacers as a second mask. The second conductive impurities may be implanted such that each of the first and second impurity regions includes a first portion having a first depth, and a second portion having a second depth. The first depth may be greater than the second depth. The second portion of the first and second impurity regions may be covered by the gate spacer.

According to at least some example embodiments, the second portion of the first impurity region and the second impurity region may be formed in a portion of the substrate on which a gate spacer is formed. A surface of the portion of the substrate in which the second portion of the first and second impurity region is formed may be entirely covered by the gate spacer and the gate stack structure.

At least one other example embodiment provides a method of manufacturing a charge trap memory device. The charge trap memory device may include a gate stack formed of a tunneling film, a charge trap layer, an α-phase crystalline aluminum oxide layer, and a gate electrode, each of which may be sequentially stacked on a substrate. According to at least this example embodiment, an amorphous aluminum oxide layer may be formed on the charge trap layer. A metal layer having a space lattice similar or substantially similar to that of the α-phase crystalline aluminum oxide layer may be formed on the amorphous aluminum oxide layer. The amorphous aluminum oxide layer may be changed to the α-phase crystalline aluminum oxide layer by performing a thermal treatment on the resultant structure including the metal layer.

According to at least some example embodiments, the changing of the amorphous aluminum oxide layer to the α-phase crystalline aluminum oxide layer may further include: forming a mask on the metal layer; sequentially etching the metal layer, the amorphous aluminum oxide layer, the charge trap layer, and the tunneling film formed around the mask; and performing a thermal treatment on the resultant structure including the metal layer. The mask may define a region where the gate stack may be formed According to at least some example embodiments, after the changing of the amorphous aluminum oxide layer to the α-phase crystalline aluminum oxide layer, the method may further include: forming a mask on the metal layer; sequentially etching the metal layer, the α-phase crystalline aluminum oxide layer, the charge trap layer, and the tunneling film, which are formed around the mask; and removing the mask. The mask may define a region where the gate stack is to be formed. The thermal treatment may be performed on the resultant structure including the metal layer, after the mask is removed. The metal layer may be formed of, for example, one of a TiCN layer, a Ru layer of which a crystal direction is (0001), and a $Rh_2O_3$ layer. A thermal treatment for changing the metal layer to a conductive layer when the metal layer is a $Rh_2O_3$ layer may also be performed. The thermal treatment may be performed at normal pressure in a temperature range of between about 1000° C. to about 1300° C., inclusive.

BRIEF DESCRIPTION OF THE DRAWINGS

Example embodiments will be described in detail with respect to the attached drawings in which.

DETAILED DESCRIPTION OF EXAMPLE EMBODIMENTS

Figure 1:
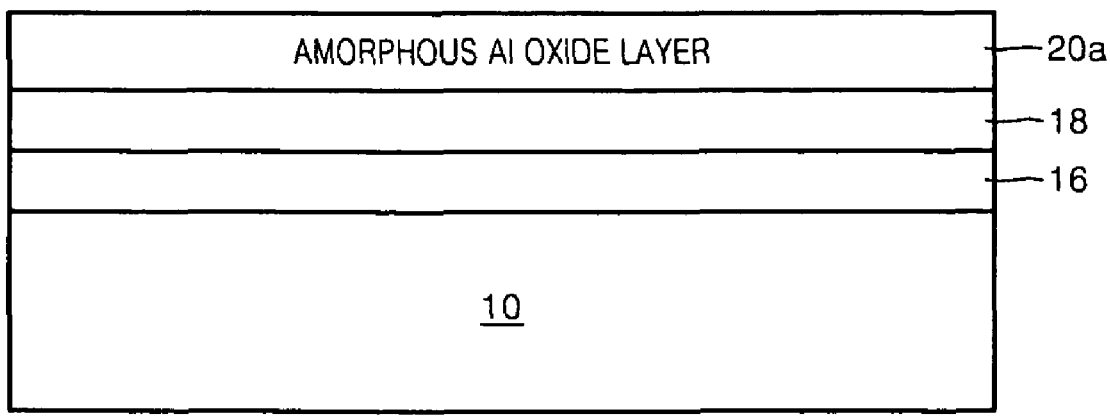
FIGS. 1 through 9 are cross-sectional views illustrating a method of manufacturing a charge trap memory device according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. In the drawings, the thicknesses of layers and regions are exaggerated for clarity.

A method of manufacturing a charge trap memory device according to an example embodiment (hereinafter, a method of manufacturing according to the present invention) will now be described. A method of increasing an energy band gap according to an example embodiment will be described together with the method of manufacturing according to an example embodiment.

Example embodiments will be described with regard to amorphous and crystalline aluminum oxide layers. However, example embodiments may be utilized in connection with materials other than aluminum, such as, aluminum alloys, or other metals having similar or substantially similar material properties.

Referring to FIG. 1, a tunneling film 16, a charge trap layer 18 and an amorphous aluminum oxide layer 20a may be formed (e.g., sequentially formed) on a substrate 10. The substrate 10 may be a semiconductor substrate, such as, a p-type silicon substrate or the like.

The tunneling film 16 may be an oxide film having a given or desired thickness. For example, the tunneling film 16 may be a silicon oxide film, a silicon oxynitride film or the like. The charge trap layer 18 may be a material layer including trap sites of a given or desired density and having a given or desired thickness, for example, a silicon nitride layer or the like. The charge trap layer 18 may include a plurality of nanodots, and may be a metal-doped high-k oxide including a plurality of aluminum oxide dots.

Figure 2:
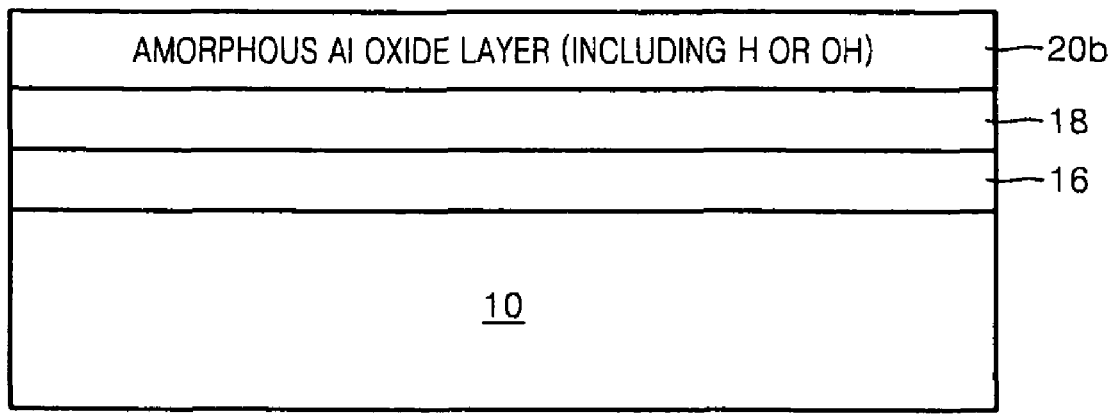

Referring to FIG. 2, hydrogen (H) or hydroxyl group (OH) including OH coupling may be introduced into the amorphous aluminum oxide layer 20a to form an amorphous aluminum oxide layer 20b. The amorphous aluminum oxide layer 20b may be an amorphous aluminum oxide layer including hydrogen (H) or hydroxyl group (OH) including OH coupling. Hereinafter, the amorphous aluminum oxide layer 20b will be referred to as OH-material layer 20b, and the hydroxyl group including OH coupling will be referred to as 'OH'.

According to at least one example embodiment, the OH-material layer 20b may be formed by introducing H or OH into the amorphous aluminum oxide layer 20a using, for example, a wet oxidation method or the like. The wet oxidation method may be performed at a given or desired temperature and pressure in, for example, a steam atmosphere. The wet oxidation method may include a thermal treatment performed at a relatively high temperature and atmospheric pressure, or at a relatively low temperature (e.g., between about 100° C. and about 450° C., inclusive) and a relatively high pressure (e.g., between about 5 atm and about 60 atm, inclusive). The temperature of the wet oxidation may vary according to or based on the composition of the charge trap layer 18 formed below the amorphous aluminum oxide layer 20a. For example, when the charge trap layer 18 is a silicon nitride (SiN) film, the wet oxidation may be performed in a temperature range between about 500° C. and about 1000° C., inclusive.

The wet oxidation process may increase H coupling or OH coupling in the amorphous aluminum oxide layer 20a to form the OH-material layer 20b.

Instead of a wet oxidation method, H or OH may be introduced into the amorphous aluminum oxide layer 20a (to form the OH-material layer 20b) using one of an ion implantation method, a plasma doping method, a furnace thermal treatment method or the like. When the OH-material layer 20b is formed using an ion implantation method or the plasma doping method, a thermal treatment process may be performed on the amorphous aluminum oxide layer 20a in an oxygen or similar atmosphere. However, when the amorphous aluminum oxide layer 20a is an amorphous oxygen-rich aluminum oxide layer, the oxygen atmosphere thermal treatment may be omitted.

According to at least some example embodiments, a densification process may be performed on the amorphous aluminum oxide layer 20a before or after the wet oxidation. In one example, the densification process may be performed before the wet oxidation process, for example, before injecting or introducing H or OH into the amorphous aluminum oxide layer 20a.

Figure 3:
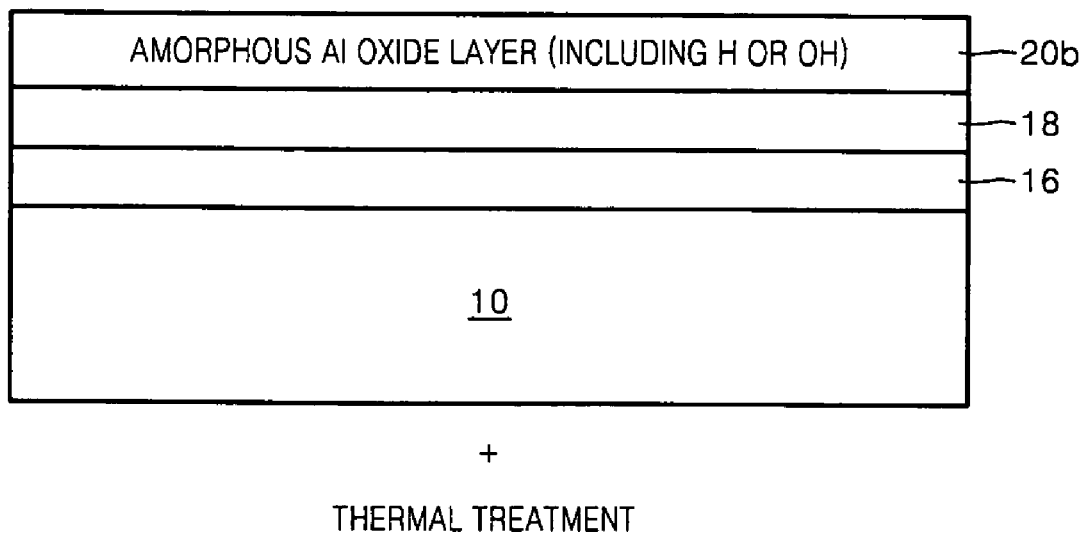
Figure 4:
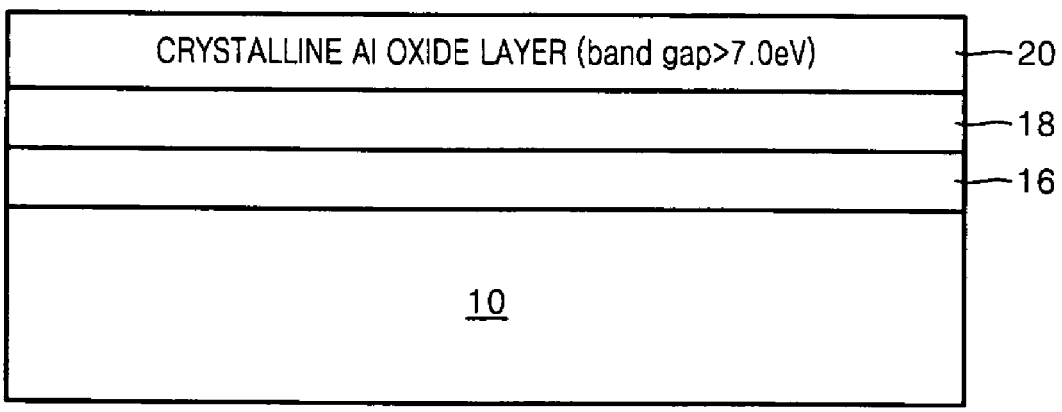

Referring to FIGS. 3 and 4, a crystalline aluminum oxide layer 20 may be formed by crystallizing the OH material layer 20b. The OH material layer 20b may be crystallized by performing a thermal treatment process on the resultant structure including the OH-material layer 20b. The thermal treatment process may be performed at least once or a plurality of times, for example, twice. The crystalline structure of the crystalline aluminum oxide layer 20 may be a κ-phase or α-phase structure, but not a γ-phase structure. The crystalline aluminum oxide layer 20 may operate as a charge suppression or blocking layer.

The thermal treatment process may be performed at a given temperature, for example, between about 800° C. and about 1300° C., inclusive. By performing the thermal treatment once at a relatively high temperature, H or OH included in the OH-material layer 20b may be at least partially removed when forming the crystalline aluminum oxide layer 20 as illustrated in FIG. 4. Although a portion of the H or OH introduced into the amorphous aluminum oxide layer 20a may be removed, the crystalline aluminum oxide layer 20 may still include H or OH.

In an example embodiment in which the thermal treatment process is performed twice, a primary thermal treatment process may be performed to at least partially remove H or OH from the OH-material layer 20b. The primary thermal treatment process may be performed at a temperature lower than the crystallization temperature of the OH-material layer 20b. Following the primary thermal treatment, a secondary thermal treatment may be performed at a relatively high temperature, for example, between about 800° C. and about 1300° C., inclusive.

According to example embodiments, the existing H coupling or OH coupling in the OH material layer 20b may contribute to (or assist in) generating a crystalline nucleus, while reducing formation energy or energies necessary for crystallization. Accordingly, when H or OH is injected or introduced into the amorphous aluminum oxide layer 20a (e.g., using a wet oxidation method, an ion implantation method or a plasma doping method) and then annealed, γ-phase is suppressed in the amorphous aluminum oxide layer 20a and the amorphous aluminum oxide layer 20a may become a crystalline aluminum oxide layer 20 having a κ-phase or α-phase, but not a γ-phase. Accordingly, an energy band gap of the resultant crystalline aluminum oxide layer 20 may be greater than or equal to about 7.0 eV.

In at least one other example embodiment, the formation of the amorphous aluminum oxide layer 20a and the wet oxidation of the amorphous aluminum oxide layer 20a may be performed in a single process. For example, while depositing an aluminum oxide layer using, for example, a vapor deposition method, an atomic layer deposition (ALD) method or the like, H or OH may be introduced into the aluminum oxide layer. In this example, the aluminum oxide layer including H or OH may be formed in an amorphous or crystalline state.

If the aluminum oxide layer including H or OH is formed in a crystalline state, a thermal treatment process may be performed to at least partially remove the H or OH from the crystalline aluminum oxide layer. The thermal treatment process may be the same or substantially the same as the thermal treatment process used to crystallize the amorphous aluminum oxide layer 20a.

If the aluminum oxide layer is formed in an amorphous state, the amorphous aluminum oxide layer may transition to a crystalline aluminum oxide layer including H or OH when H or OH is introduced. The transition to the crystalline aluminum oxide layer may occur at a temperature greater than or equal to about 800° C., for example, between about 800° C. and about 850° C., inclusive. In this example, H or OH may be removed (e.g., at least partially or completely removed) from the crystalline aluminum oxide layer including H or OH using a thermal treatment process such as the thermal treatment process for crystallizing the amorphous aluminum oxide layer 20a.

Figure 5:
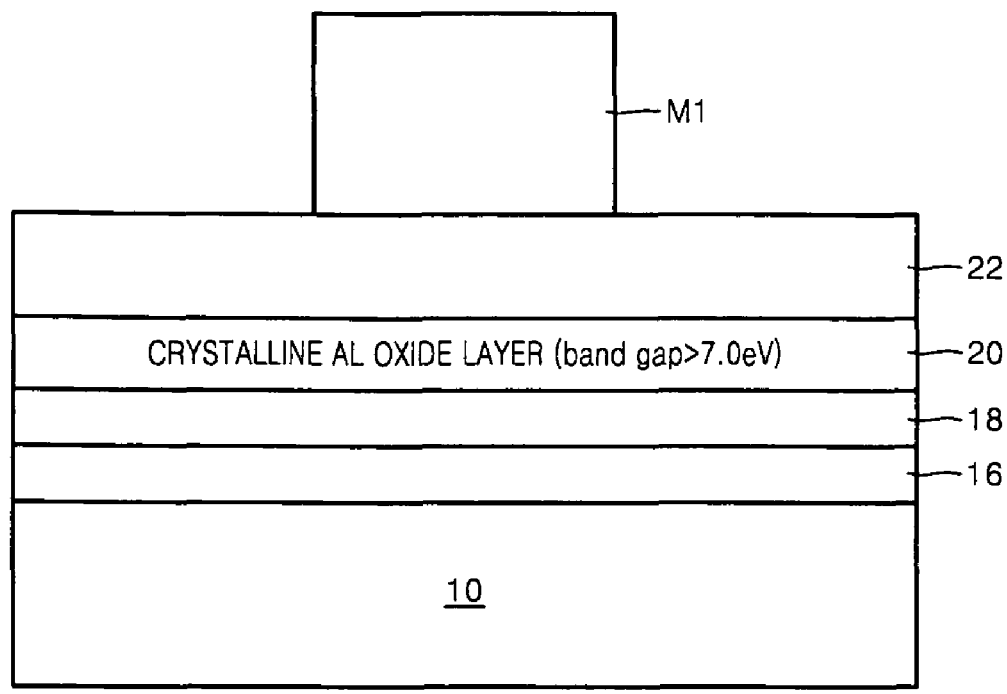

Referring to FIG. 5, a gate electrode 22 may be formed on the crystalline aluminum oxide layer 20. The gate electrode 22 may be a conductive layer of which a work function is greater than or equal to about 4 eV. For example, the gate electrode 22 may be a tantalum nitride (TaN) layer or other layer having similar material properties. A mask M1 may formed on the gate electrode 22. The mask M1 may define a region in which a gate may be formed. An anisotropy etching (or similar process) may be performed on layers around the mask M1 until a portion of the top surface of the substrate 10 is exposed, thereby forming a gate stack structure 23.

Figure 6:
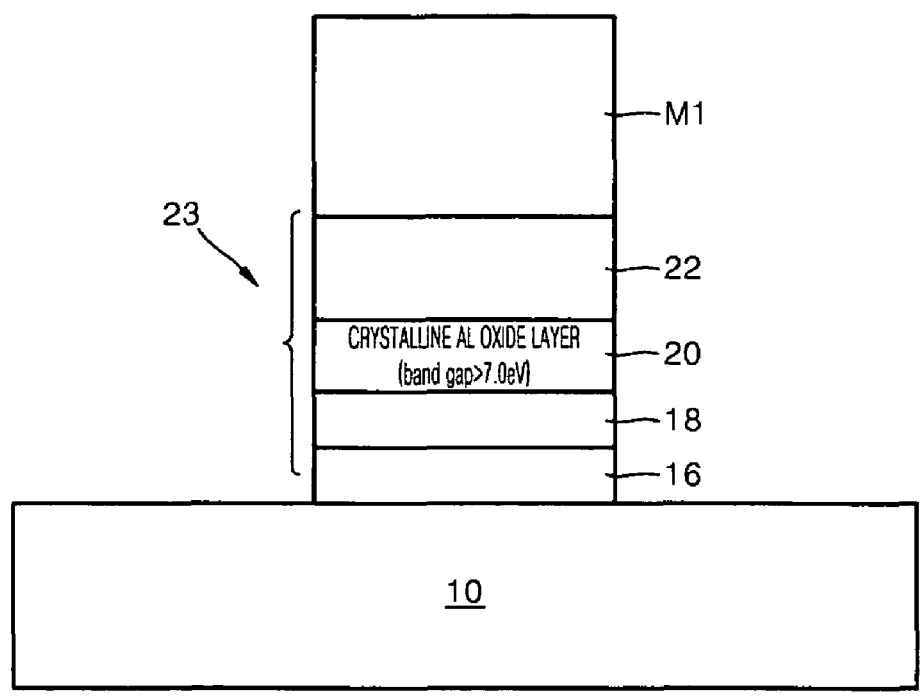

The gate stack structure 23 may include the tunneling film 16, the charge trap layer 18, the crystalline aluminum oxide layer 20, and the gate electrode 22 stacked sequentially on the substrate 10 as illustrated in FIG. 6. After performing the anisotropy etching, the mask M1 may be removed.

Figure 7:
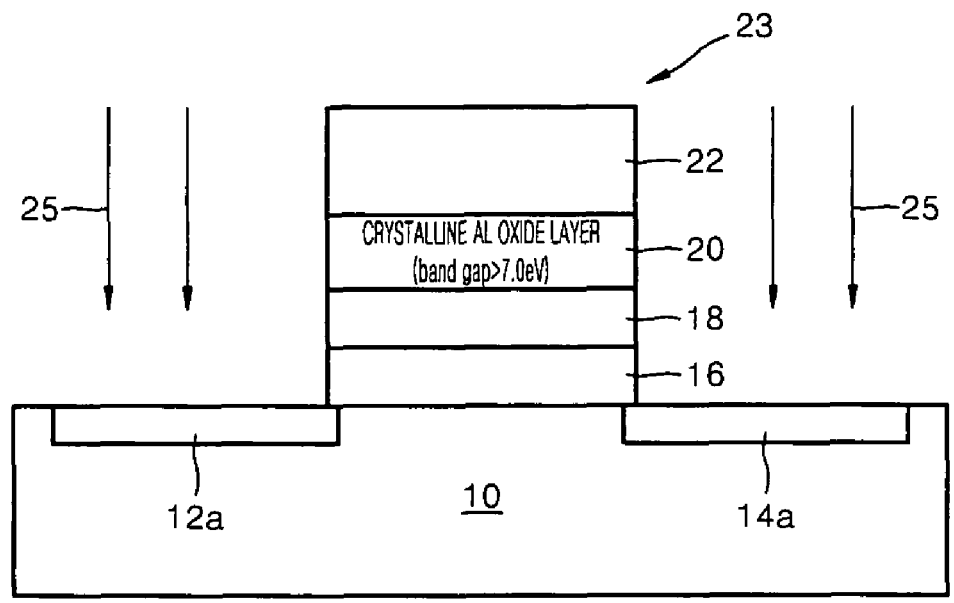

As shown in FIG. 7, first conductive impurities 25 may be implanted in the substrate 10 using an ion implantation method to form first and second shallow impurity regions 12a and 14a in the substrate 10. The gate stack structure 23 may serve as a mask during the ion implantation. In this example, the first conductive impurities 25 may differ from impurities implanted in the substrate 10. For example, if the substrate 10 includes p-type impurities, the first conductive impurities 25 may be n-type impurities. Alternatively, if the substrate 10 includes n-type impurities, the first conductive impurities 25 may be p-type impurities.

Figure 8:
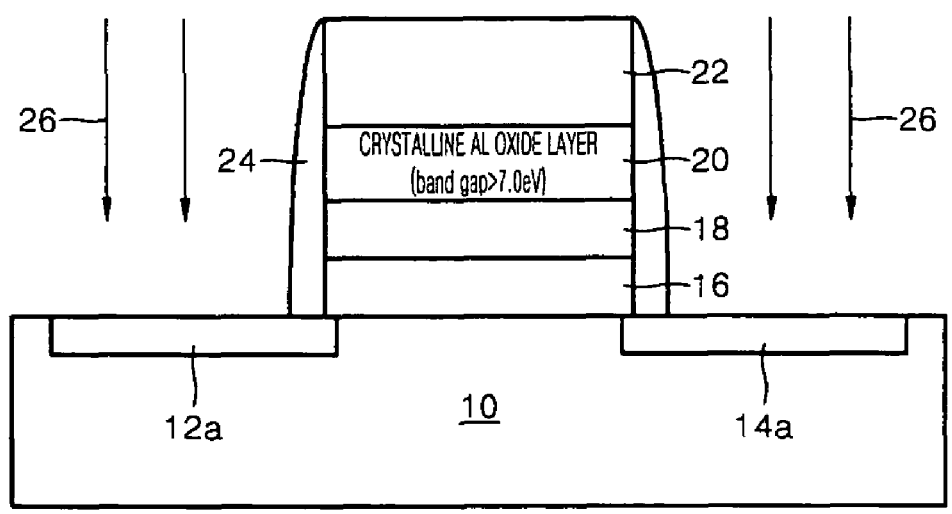

Referring to FIG. 8, a gate spacer 24 may be formed on each side surface of the gate stack structure 23. The gate spacer 24 may be formed of a silicon oxide film or other material film having similar or substantially similar material properties. Second conductive impurities 26 may be implanted in the substrate 10 using an ion implantation method to form a deep impurity region in each of the first and second shallow impurity regions 12a and 14a.

The ion implantation method used to implant the second conductive impurities 26 may utilize the gate stack structure 23 and the gate spacer 24 as masks. The second conductive impurities 26 may be of the same type as the first conductive impurities 25. For example, the second conductive impurities 26 may be n-type impurities, if the substrate 10 includes p-type impurities. Alternatively, the second conductive impurities 26 may be p-type impurities if the substrate 10 includes n-type impurities.

Figure 9:
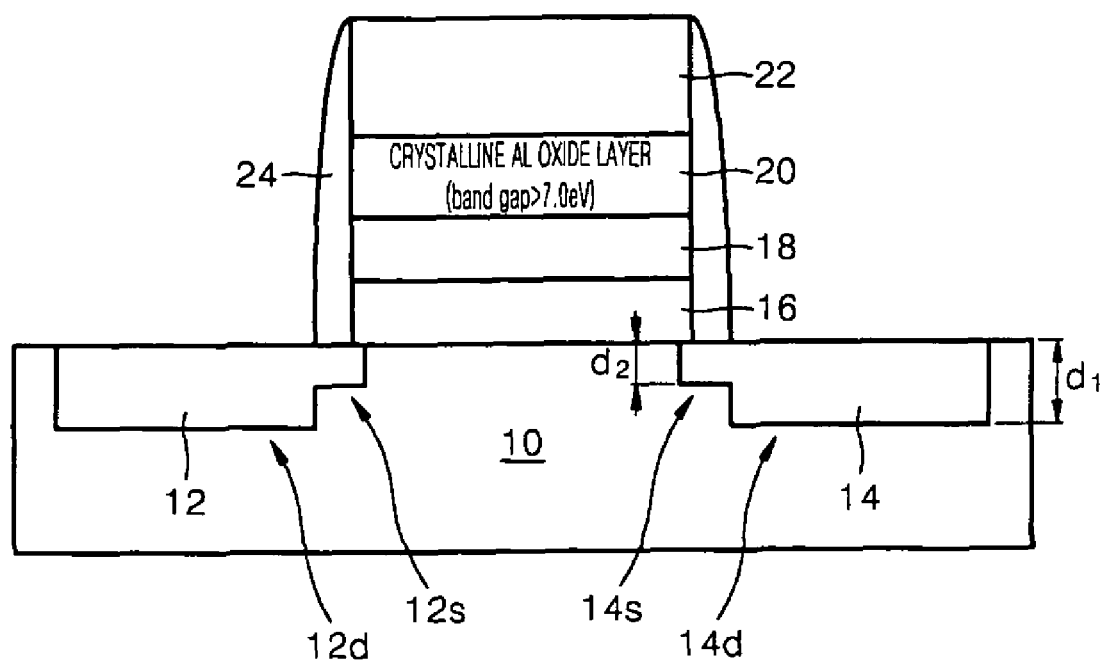

The ion implantation energy of the second conductive impurities 26 may be greater than the ion implantation energy used to form the first and second shallow impurity regions 12a and 14a by implanting the first conductive impurities 25. Accordingly, the second conductive impurities 26 may be implanted to a greater depth than the first conductive impurities. For example, the second conductive impurities 26 may reach a region or portion of the substrate 10 that is deeper than the first and second shallow impurity regions 12a and 14a formed by implanting the first conductive impurities 25. Accordingly, regions of the substrate that are not covered by the gate spacer 24 may be more deeply doped (e.g., doped to a greater depth) than regions covered by the gate spacer 24, resulting in the lightly doped drain (LDD)-type first and second impurity regions 12 and 14 as shown in FIG. 9. Subsequent processes may be performed according to conventional methods.

Referring still to FIG. 9, the LDD-type first impurity region 12 may include a first portion 12d and a second portion 12s. The first portion 12d may be an ion implantation region in which conductive impurity ions are implanted at a first depth $d_1$ from the surface of the substrate 10. The first depth $d_1$ may be a relatively deep depth from the surface of the substrate 10. The second portion 12s may be an ion implantation region in which conductive impurity ions are implanted at a second depth $d_2$ from the surface of the substrate 10. The second depth $d_2$ may be relatively shallow depth from the surface of the substrate 10. Accordingly, the first depth $d_1$ may be greater than the second depth $d_2$.

As further shown in FIG. 9, the LDD-type second impurity region 14 may include a first portion 14d and a second portion 14s. The first portion 14d may be an ion implantation region in which conductive impurity ions are implanted at first depth $d_1$ from the surface of the substrate 10. As discussed above, the first depth $d_1$ may be a relatively deep depth from the surface of the substrate 10. The second portion 14s may be an ion implantation region in which conductive impurity ions are implanted at the second depth $d_2$ from the surface of the substrate 10. As discussed above, the second depth $d_2$ may be relatively shallow depth from the surface of the substrate 10.

As noted above, the depth of the impurities in the first portion 12d of the first impurity region 12 may be equal or substantially equal to the depth of the impurities in the first portion 14d of the second impurity region 14. Similarly, the depth of the impurities in the second portion 12s of the first impurity region 12 may be equal or substantially equal to the depth of the impurities in the second portion 14s of the second impurity region 14.

Referring back to FIG. 1, according to example embodiments, a crystalline material oxide layer, for example, a crystalline aluminum oxide layer, may be formed instead of the amorphous material layer 20a. In this example, the thermal treatment performed in FIG. 3 may be a re-crystallization process with respect to the aluminum oxide layer.

Hereinafter, experimental examples illustrating that an energy band gap increases with respect to the crystalline aluminum oxide layer ($Al_2O_3$) obtained using a wet oxidation method and the subsequent thermal treatment method as described in accordance with example embodiments will be described.

Figure 10:
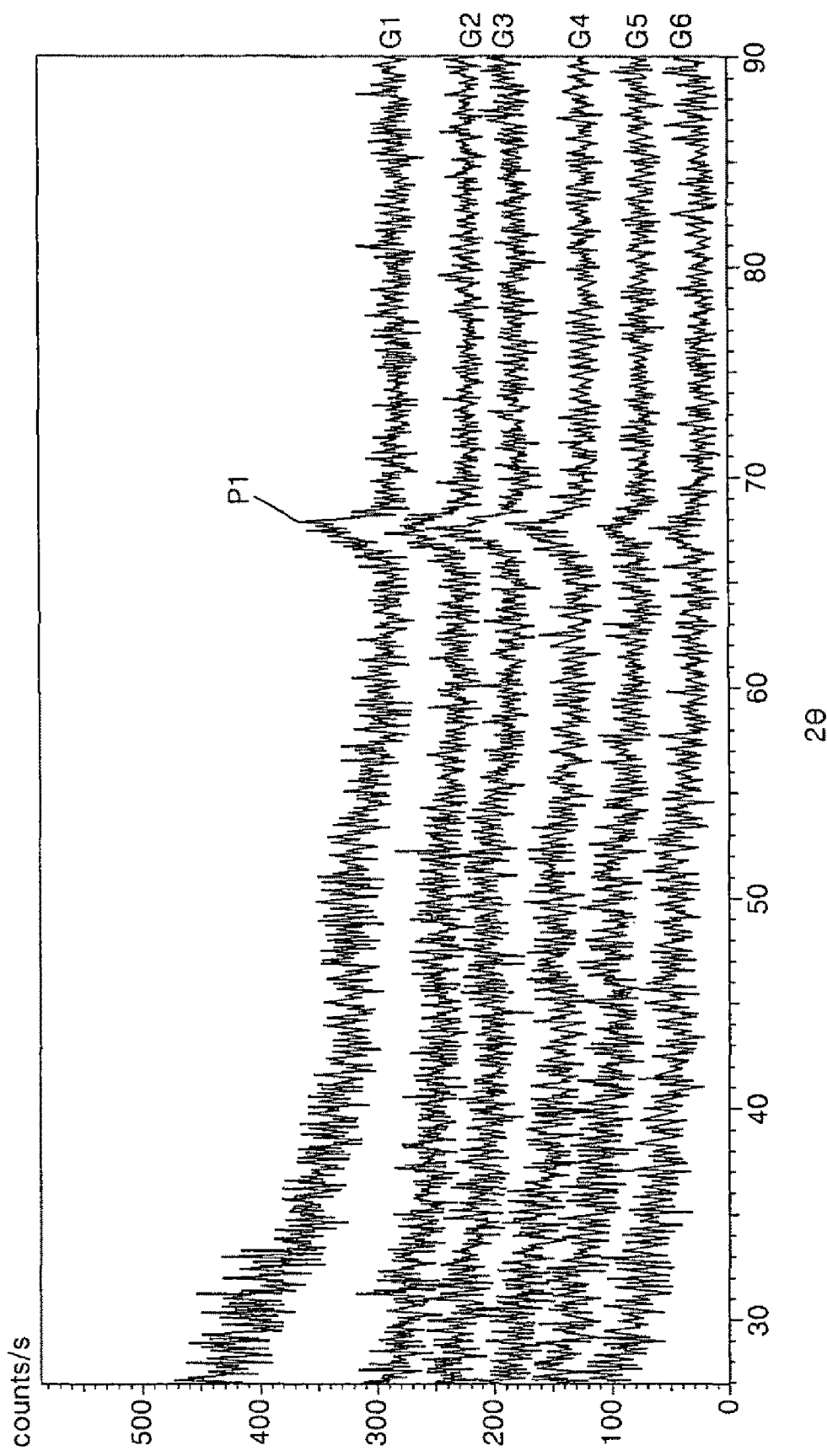
FIG. 10 is a graph illustrating a result of x-ray diffraction analysis performed with respect to an $Al_2O_3$ layer obtained by performing a thermal treatment after performing wet oxidation at relatively high pressure and relatively low temperature, according to an experimental example.

FIG. 10 is a graph illustrating a result of x-ray diffraction analysis performed with respect to an $Al_2O_3$ layer obtained by performing a thermal treatment after performing a wet oxidation at a relatively high pressure and relatively low temperature, according to an example embodiment.

Figure 11:
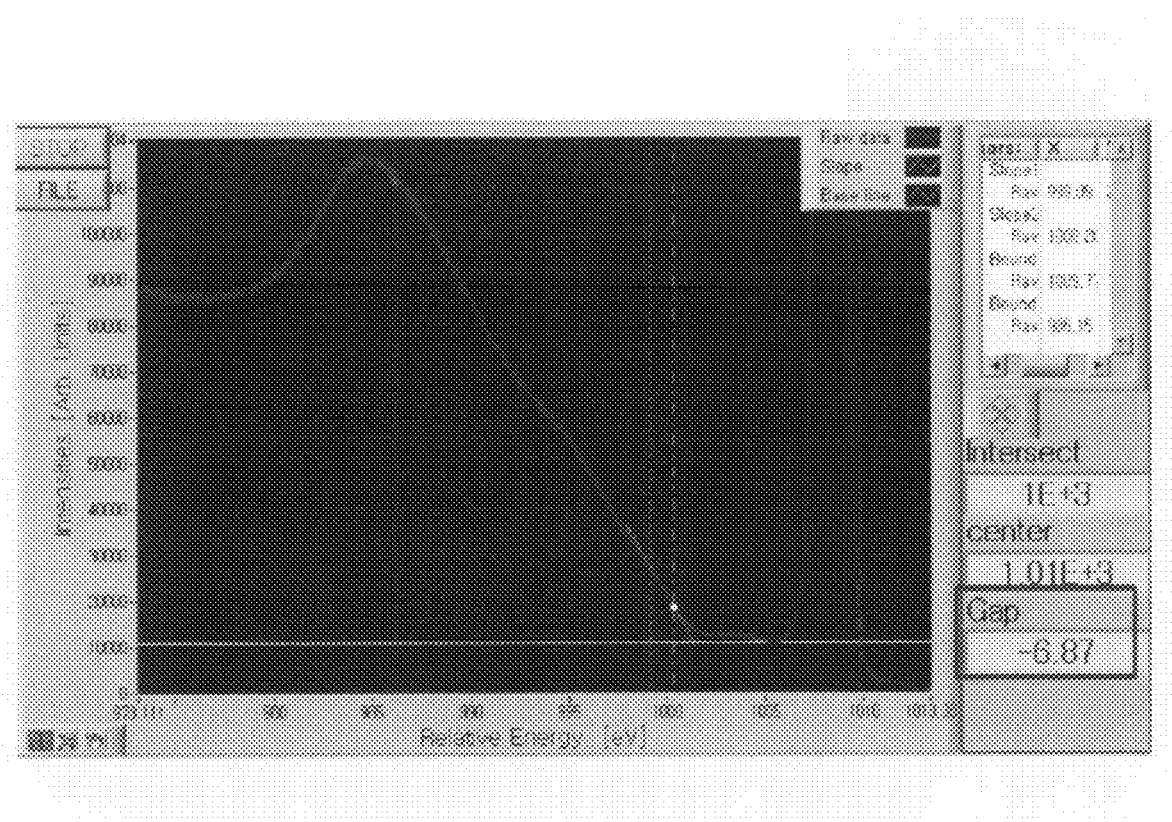
FIG. 11 is an image illustrating a result of reflected electron energy loss spectroscopy (REELS) analysis performed with respect to the $Al_2O_3$ layer having the result of x-ray diffraction analysis of FIG. 10.

FIG. 11 is an image illustrating a result of reflected electron energy loss spectroscopy (REELS) analysis performed with respect to the $Al_2O_3$ layer having the x-ray diffraction analysis results shown in FIG. 10. The $Al_2O_3$ layer used to perform the REELS analysis of FIG. 11 underwent a densification process at a temperature of 800° C. before performing a wet oxidation process.

In FIG. 10, a first graph G1 illustrates a result of x-ray diffraction analysis performed with respect to a crystalline aluminum oxide layer obtained by performing a plurality of processes (crystallization→wet oxidation→removal of hydroxyl group and recrystallization at 1000° C.) on an amorphous aluminum oxide layer. A second graph G2 illustrates a result of x-ray diffraction analysis performed with respect to a crystalline aluminum oxide layer obtained by performing a plurality of processes (crystallization at 1100° C.→wet oxidation→removal of hydroxyl group at 600° C.→recrystallization at 1000° C.) on an amorphous aluminum oxide layer.

A third graph G3 illustrates a result of an x-ray diffraction analysis performed with respect to a crystalline aluminum oxide layer obtained by performing a plurality of processes (densification at 800° C.→wet oxidation→removal of hydroxyl group and crystallization at 1000° C.) on an amorphous aluminum oxide layer. A fourth graph G4 illustrates a result of an x-ray diffraction analysis performed with respect to a crystalline aluminum oxide layer obtained by performing a plurality of processes (densification at 800° C.→wet oxidation→removal of hydroxyl group at 600° C.→crystallization at 1000° C.) on an amorphous aluminum oxide layer. A fifth graph G5 illustrates a result of an x-ray diffraction analysis performed with respect to a crystalline aluminum oxide layer obtained by performing a plurality of processes (wet oxidation→removal of hydroxyl group and crystallization at 1000° C.) on an amorphous aluminum oxide layer. A sixth graph G6 illustrates a result of an x-ray diffraction analysis performed with respect to a crystalline aluminum oxide layer obtained by performing a plurality of processes (wet oxidation→removal of hydroxyl group at 600° C.→crystallization at 1000° C.) on an amorphous aluminum oxide layer.

Referring to FIG. 10, as shown from the changes between graphs from the first graph G1 to the sixth graph G6, a peak P1 (which appears when the crystalline aluminum oxide layer has a γ-phase crystal structure) disappears.

Thus, when an amorphous aluminum oxide layer transitions to a crystalline aluminum oxide layer using example embodiments, a γ-phase may be suppressed in the resultant crystalline aluminum oxide layer. Therefore, according to example embodiments, in a process in which an amorphous aluminum oxide layer is changed to a crystalline aluminum oxide layer, a crystal or crystalline structure of the aluminum oxide layer may change from a γ-phase to a κ-phase or an α-phase having an energy band gap greater than that of a γ-phase. For example, the crystal structure of the resultant aluminum oxide layer may have an energy band gap greater than or equal to about 7.0 eV.

Referring to FIG. 11, the energy band gap of the $Al_2O_3$ layer used to obtain the result of x-ray diffraction analysis of FIG. 10 is about 6.87 eV, which is greater than the energy band gap (6.5 eV) of the $Al_2O_3$ layer having a γ-phase crystal structure. However, an increasing degree of the energy band gap of the $Al_2O_3$ layer may be reduced as a result of the densification process.

Figure 12:
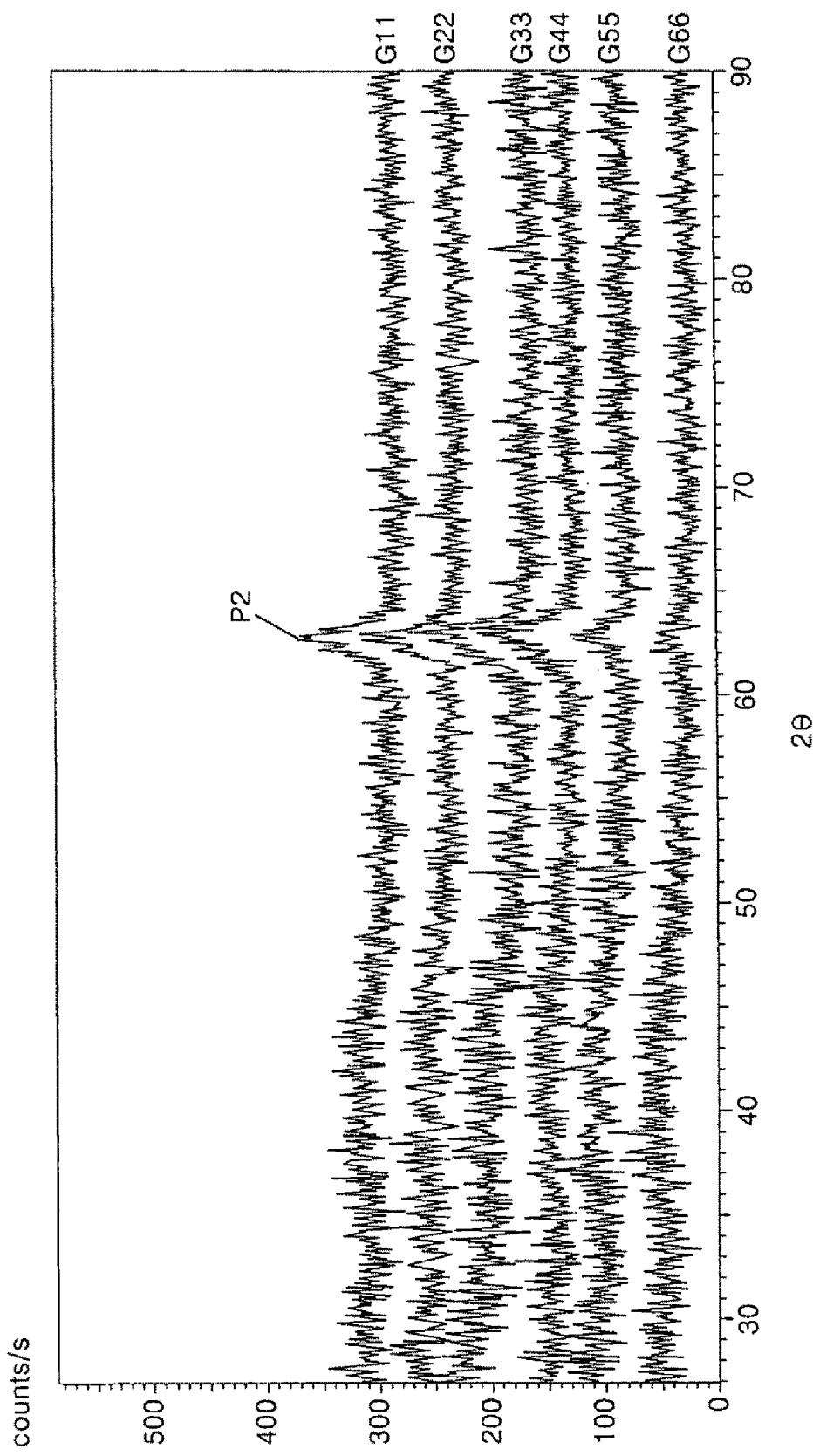
FIG. 12 is a graph illustrating a result of x-ray diffraction analysis performed with respect to a $Al_2O_3$ layer obtained by performing a thermal treatment after performing wet oxidation at atmospheric pressure and relatively high temperature, according to an experimental example.

FIG. 12 is a graph illustrating a result of an x-ray diffraction analysis performed with respect to an $Al_2O_3$ layer obtained by performing a thermal treatment at least once after performing a wet oxidation process at an atmospheric pressure and relatively high temperature, according to an example embodiment.

Figure 13:
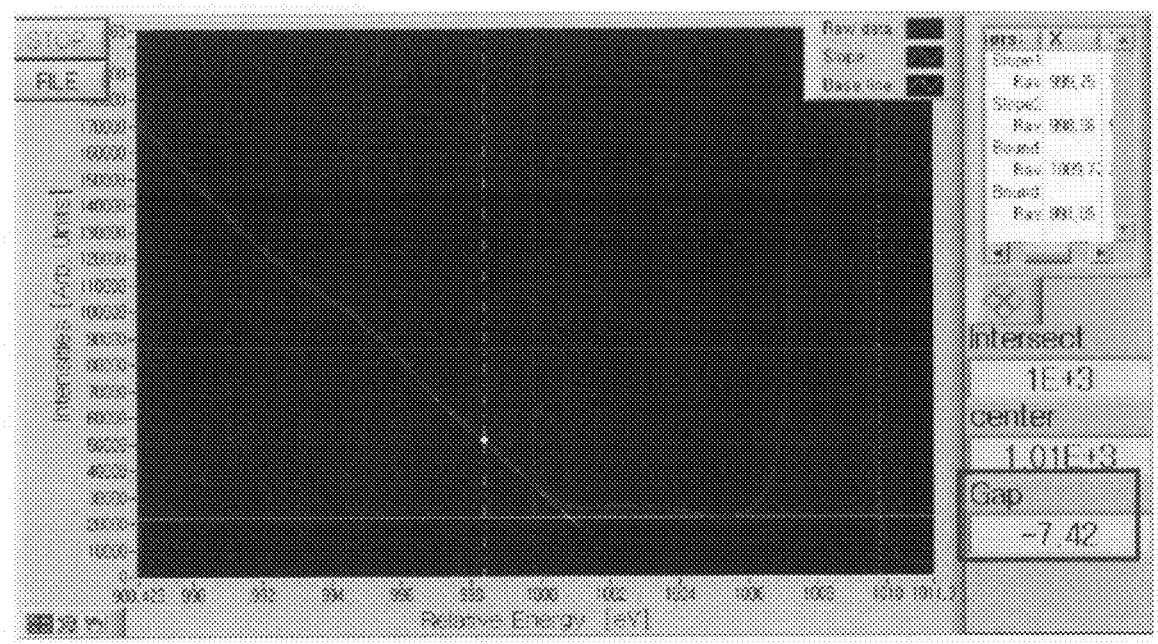
FIG. 13 is an image illustrating a result of REELS analysis performed with respect to the $Al_2O_3$ layer having the result of x-ray diffraction analysis of FIG. 12.

FIG. 13 is an image illustrating a result of REELS analysis performed with respect to the $Al_2O_3$ layer having the x-ray diffraction analysis results shown in FIG. 12 from which an energy band gap of the $Al_2O_3$ is obtained.

In FIG. 12, a first graph G11 illustrates a result of an x-ray diffraction analysis performed with respect to a crystalline aluminum oxide layer obtained by performing a plurality of processes (wet oxidation at 1000° C.→removal of hydroxyl group and recrystallization at 1000° C.) on an amorphous aluminum oxide layer. A second graph G22 illustrates a result of an x-ray diffraction analysis performed with respect to a crystalline aluminum oxide layer obtained by performing a plurality of processes (wet oxidation at 1000° C.→removal of hydroxyl group at 600° C.→recrystallization at 1000° C.) on an amorphous aluminum oxide layer.

A third graph G33 illustrates a result of an x-ray diffraction analysis performed with respect to a crystalline aluminum oxide layer obtained by performing a plurality of processes (crystallization at 1100° C.→wet oxidation at 700° C.→removal of hydroxyl group and recrystallization at 1000° C.) on an amorphous aluminum oxide layer. A fourth graph G44 illustrates a result of x-ray diffraction analysis performed with respect to a crystalline aluminum oxide layer obtained by performing a plurality of processes (crystallization at 1100° C.→wet oxidation at 700° C.→removal of hydroxyl group at 600° C.→recrystallization at 1000° C.) on an amorphous aluminum oxide layer.

A fifth graph G55 illustrates a result of x-ray diffraction analysis performed with respect to a crystalline aluminum oxide layer obtained by performing a plurality of processes (wet oxidation at 700° C.→removal of hydroxyl group and crystallization at 1000° C.) on an amorphous aluminum oxide layer. A sixth graph G66 illustrates a result of an x-ray diffraction analysis performed with respect to a crystalline aluminum oxide layer obtained by performing a plurality of processes (wet oxidation at 700° C.→removal of hydroxyl group at 600° C.→crystallization at 1000° C.) on an amorphous aluminum oxide layer.

Referring to FIG. 12, as shown from the changes from the first graph G11 to the sixth graph G66, a peak P2 (which appears when the aluminum oxide layer has a γ-phase crystal structure) may be reduced. Accordingly, as described above with regard to FIG. 10, the formation of a γ-phase crystal structure in the aluminum oxide layer may be suppressed.

Referring to FIG. 13, the energy band gap of the aluminum oxide layer aluminum oxide layer increases to about 7.42 eV, which corresponds to an energy band gap observed in $Al_2O_3$ having a κ-phase crystal structure. Such energy band gap may be further increased by varying (e.g., improving) process conditions, such as a temperature of the wet oxidation, a temperature for removing H or OH, a temperature of crystallization or optimization, or the like. According to at least some example embodiments, a crystal phase of an $Al_2O_3$ layer may be changed to an α-phase by varying and/or improving process conditions.

Therefore, according to example embodiments, the crystalline aluminum oxide layer 20 may be formed so as to have an α-phase crystal structure of which an energy band gap may be greater than about 8 eV.

Figure 14:
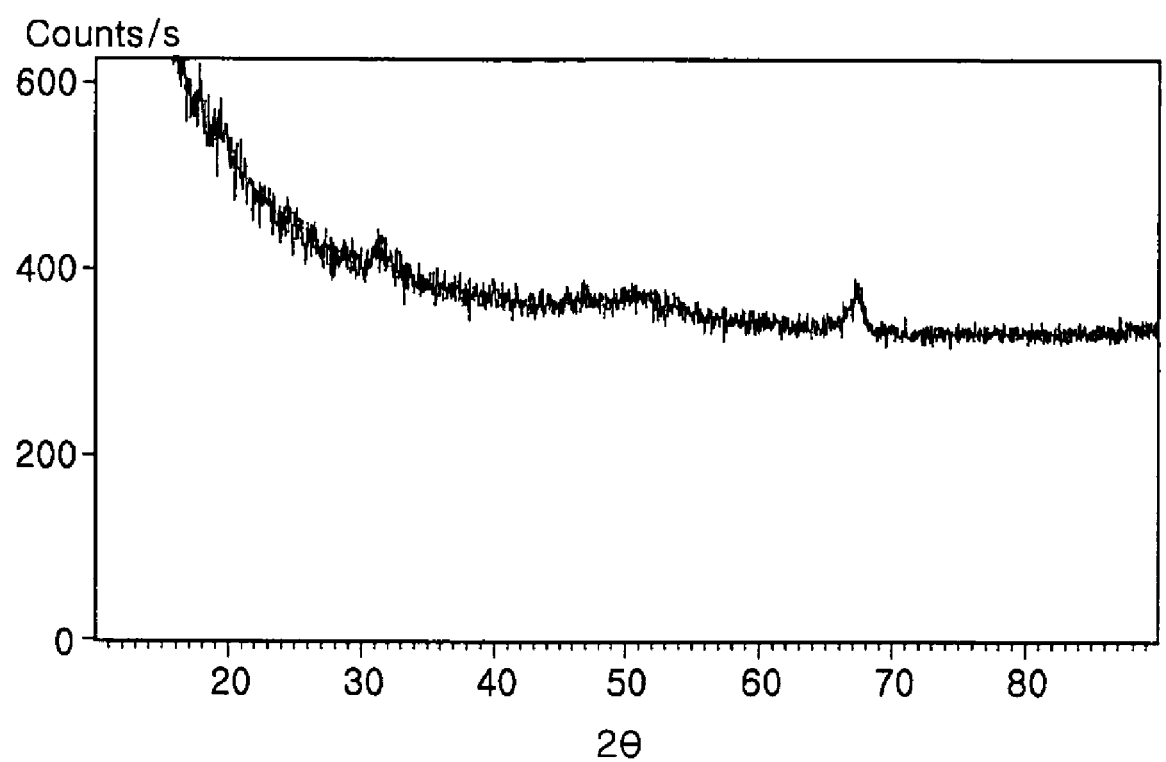
FIG. 14 is a graph illustrating a result of x-ray diffraction analysis performed with respect to a crystalline $Al_2O_3$ layer obtained by performing only a thermal treatment at 1100° C. without performing a wet oxidation with respect to an amorphous $Al_2O_3$ layer, according to an experimental example.
Figure 15:
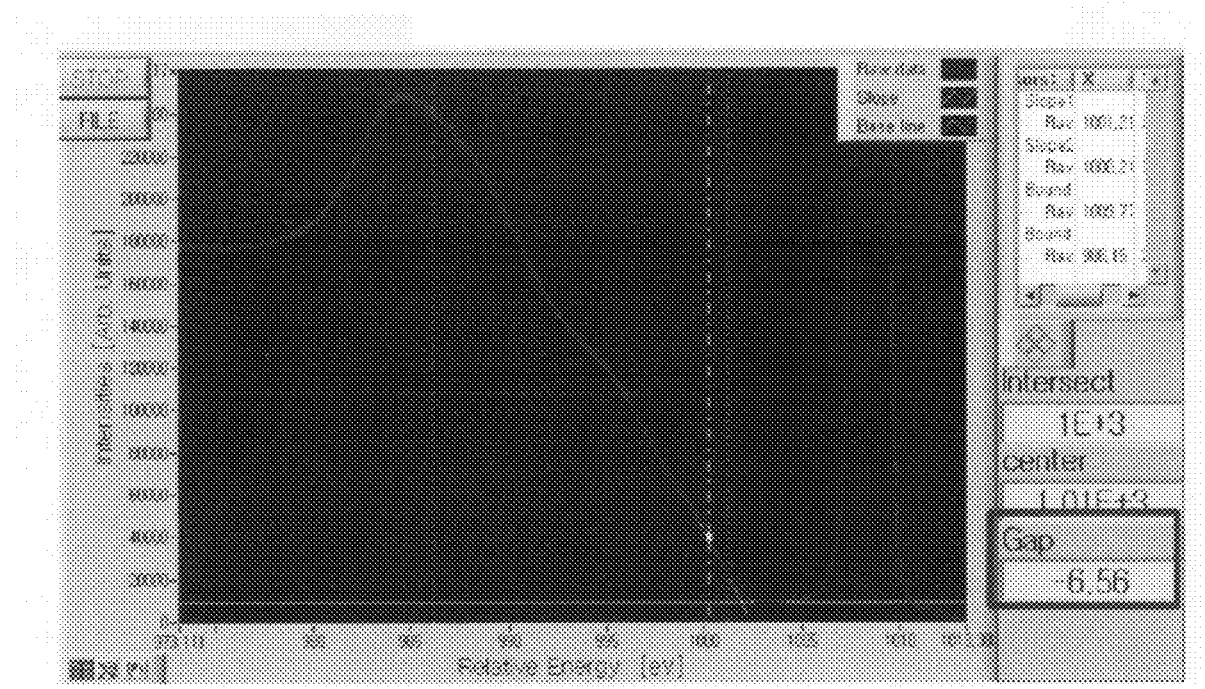
FIG. 15 is an image illustrating a result of REELS analysis performed with respect to the $Al_2O_3$ layer having the result of x-ray diffraction analysis of FIG. 14.

FIG. 14 is a graph illustrating a result of an x-ray diffraction analysis performed with respect to a crystalline $Al_2O_3$ layer obtained by performing only a thermal treatment at 1100° C. without performing a wet oxidation with respect to an amorphous $Al_2O_3$ layer, according to an example embodiment. FIG. 15 is an image illustrating a result of REELS analysis performed with respect to the $Al_2O_3$ layer having the x-ray diffraction analysis results of FIG. 14.

Referring to FIG. 14, the crystalline $Al_2O_3$ layer obtained by performing only a thermal treatment at 1100° C. without performing a wet oxidation has a γ-phase crystal structure. Referring to FIG. 15, the energy band gap the $Al_2O_3$ layer is about 6.56 eV.

Comparing FIGS. 10 through 13 with FIGS. 14 and 15, when a crystalline charge blocking $Al_2O_3$ layer is formed according to example embodiments, an energy band gap of the crystalline $Al_2O_3$ layer may be greater than that of a crystalline $Al_2O_3$ layer having a γ-phase crystal structure.

Figure 23:
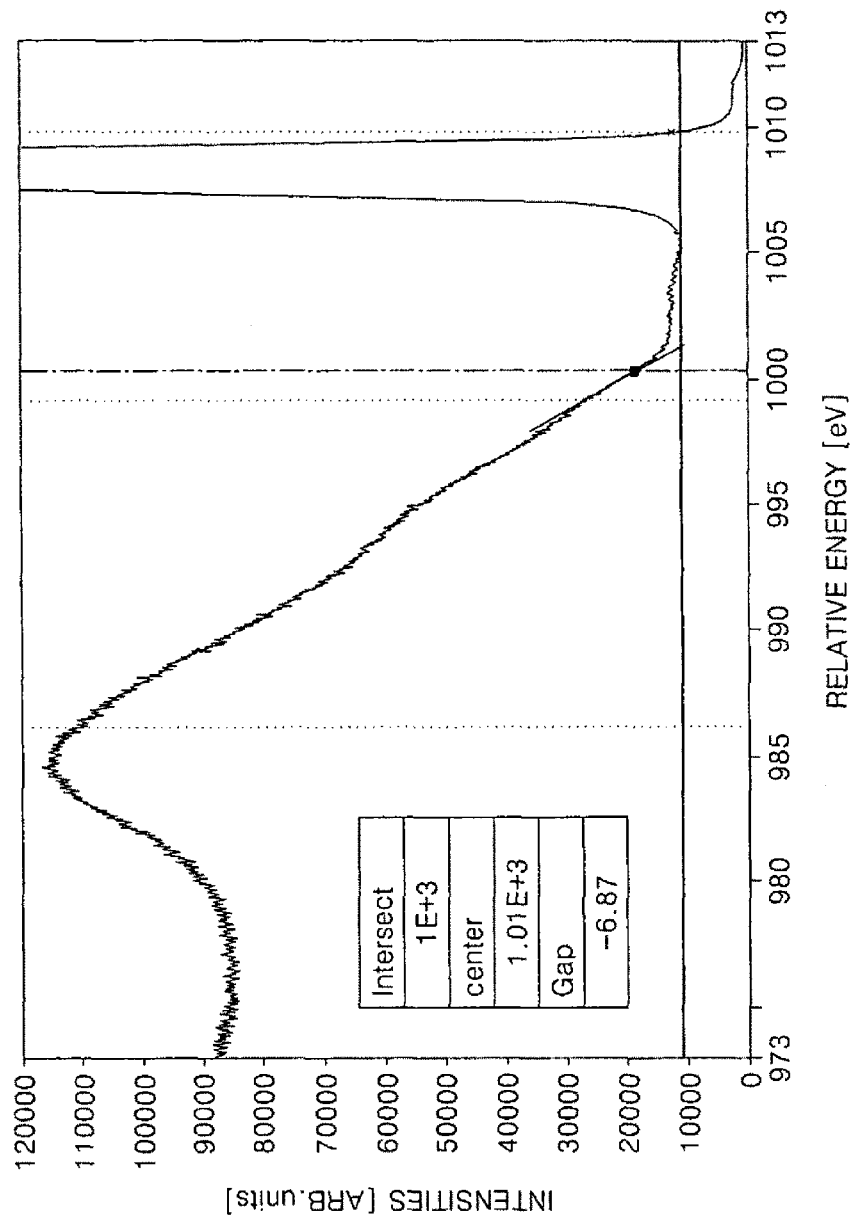
FIGS. 23-25 are CAD drawings corresponding to FIGS. 11, 13, and 15, respectively.
Figure 24:
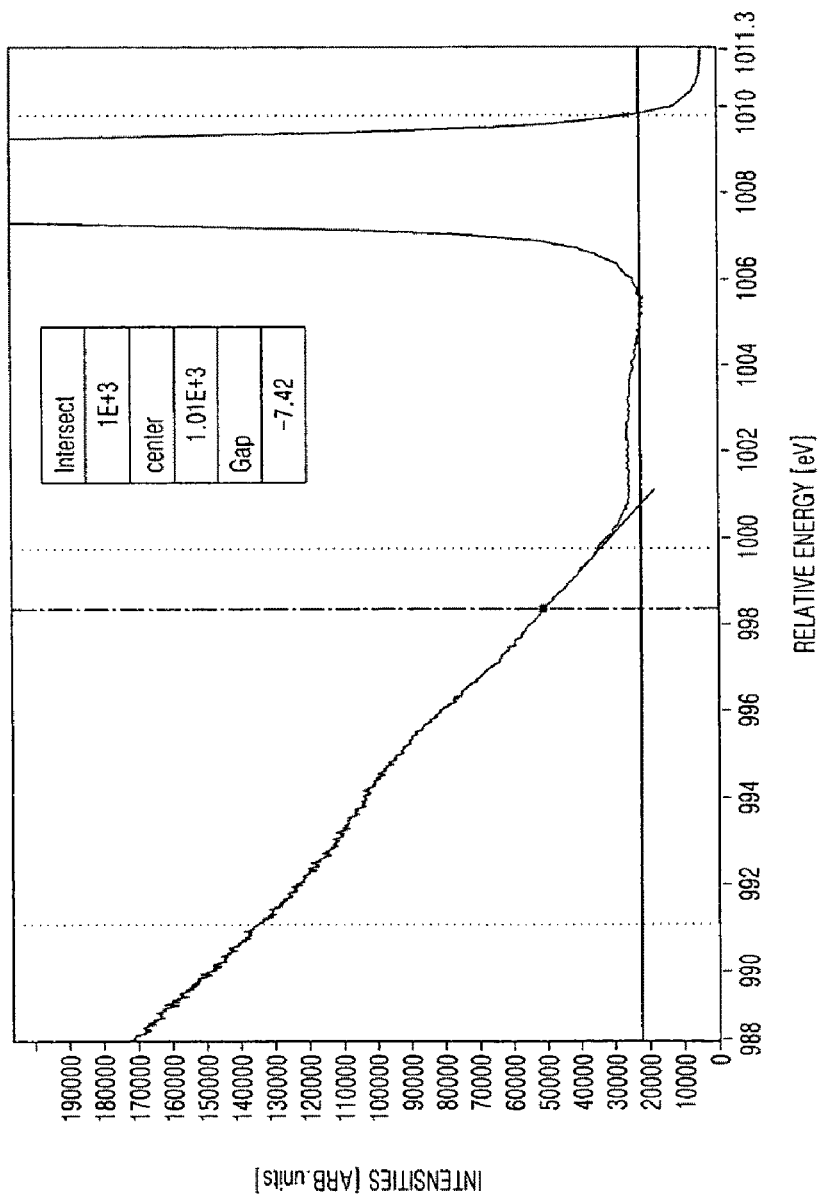
Figure 25:
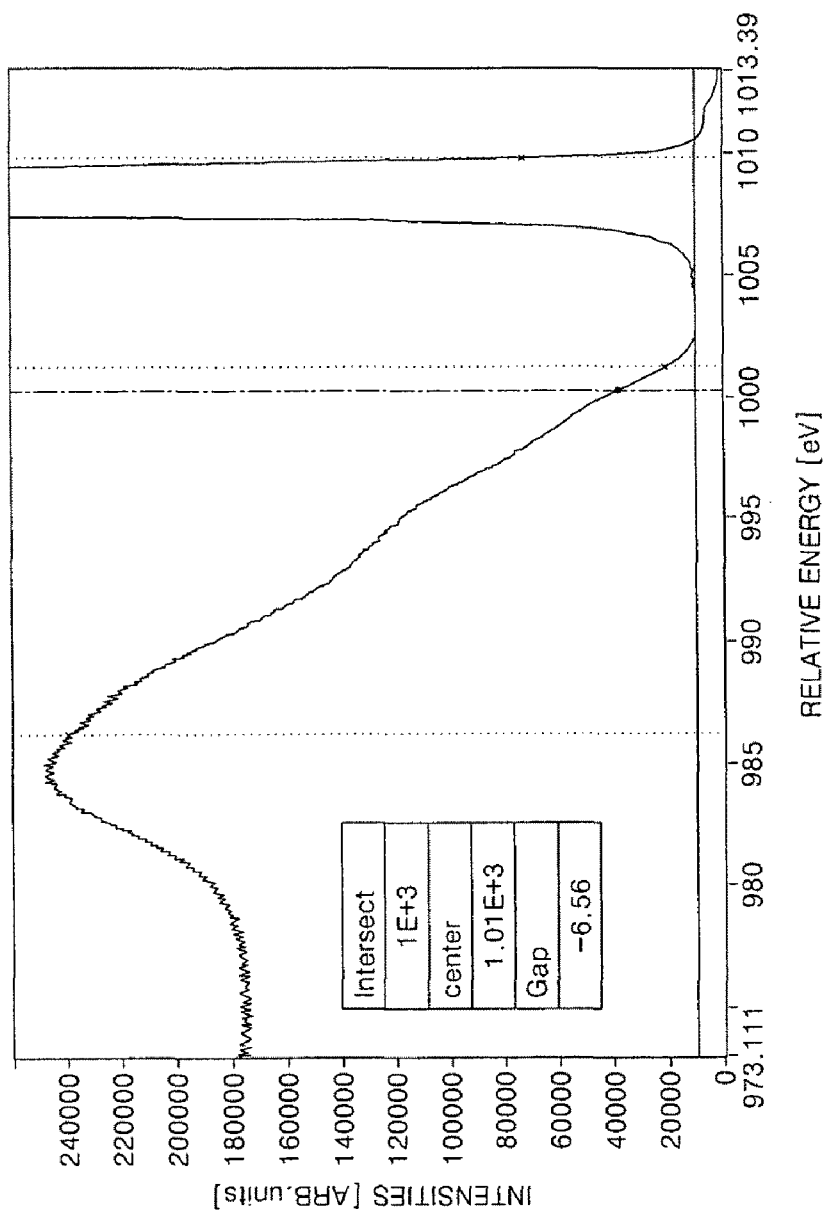

FIGS. 23-25 are CAD drawings corresponding to FIGS. 11, 13 and 15, respectively.

A method of manufacturing a charge trap memory device according to an example embodiment will be described with reference to FIGS. 16 through 22. Explanation of elements described above will be omitted for the sake of brevity.

Figure 16:
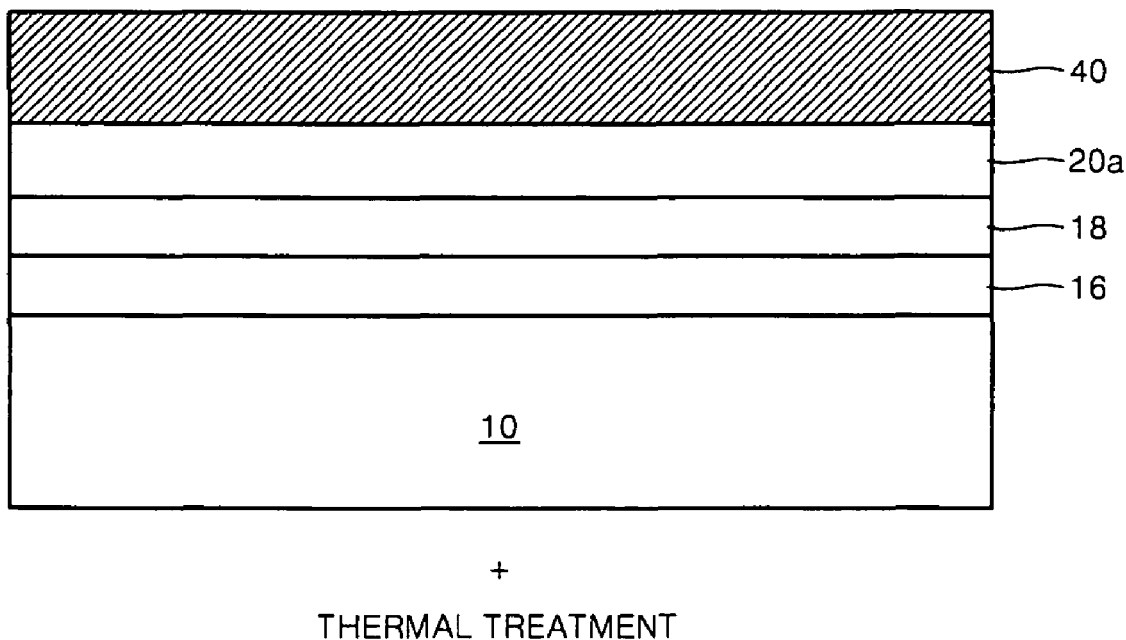
FIGS. 16 through 22 are cross-sectional views for illustrating a method of manufacturing a charge trap memory device according to example embodiments.

Referring to FIG. 16, a tunneling film 16, a charge trap layer 18, and an amorphous aluminum oxide layer 20a may be sequentially stacked on a substrate 10. A metal layer 40 may be formed on the amorphous aluminum oxide layer 20a. The amorphous aluminum oxide layer 20a may serve charge blocking layer. A space lattice of the metal layer 40 may be similar or substantially similar to that of alpha alumina (a crystalline $Al_2O_3$ layer). For example, the metal layer 40 may be a Titanium Carbonitride (TiCN) layer, a Ruthenium (Ru) layer of which a crystal direction is (0001), a Rhodium Oxide ($Rh_2O_3$) layer or similar layer.

After forming the metal layer 40, a thermal treatment may be performed on the resultant structure including the metal layer 40. The thermal treatment may be performed at a given or desired temperature, for example, in a temperature range of between about 1000° C. and about 1300° C., inclusive. Such thermal treatment may be performed using a rapid thermal anneal (RTA) or similar method.

Figure 17:
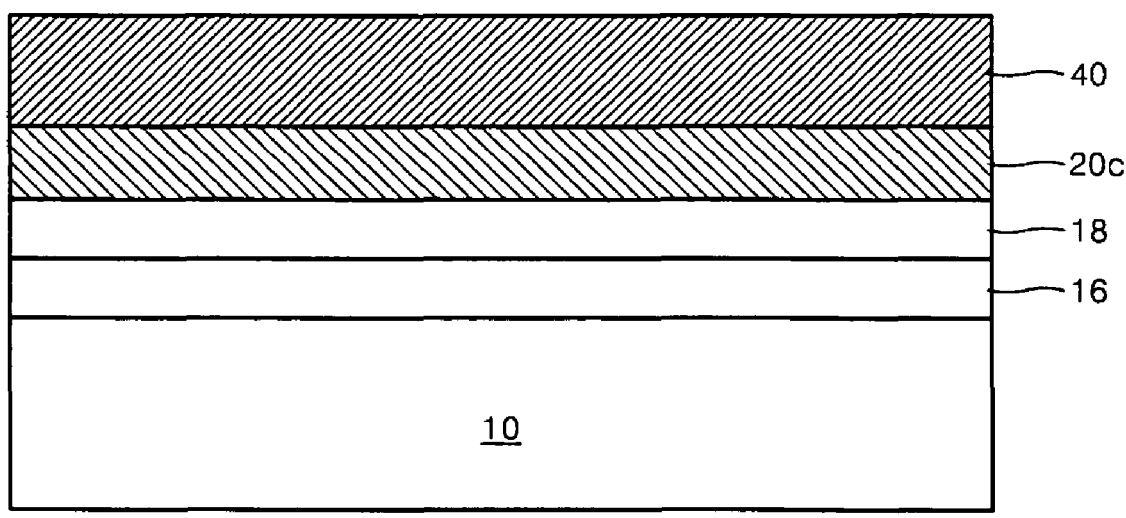

After the thermal treatment, the amorphous aluminum oxide layer 20a becomes a crystalline aluminum oxide layer 20C as illustrated in FIG. 17. During the thermal treatment, a crystal state of the metal layer 40 may influence the amorphous aluminum oxide layer 20a and the amorphous aluminum oxide layer 20a may crystallize so as to have a space lattice similar or substantially similar to that of the metal layer 40. Because the space lattice of the metal layer 40 is similar to that of alpha alumina, a crystal phase of the crystalline aluminum oxide layer 20C of FIG. 17 formed by the thermal treatment may become an α-phase.

Figure 18:
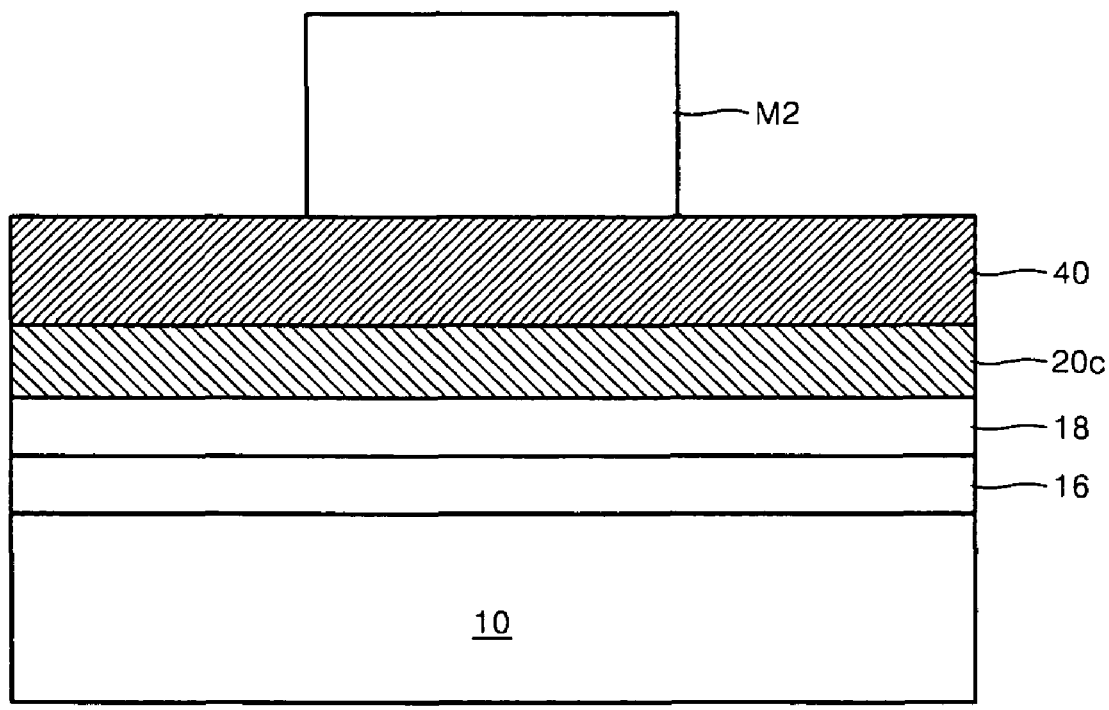
Figure 19:
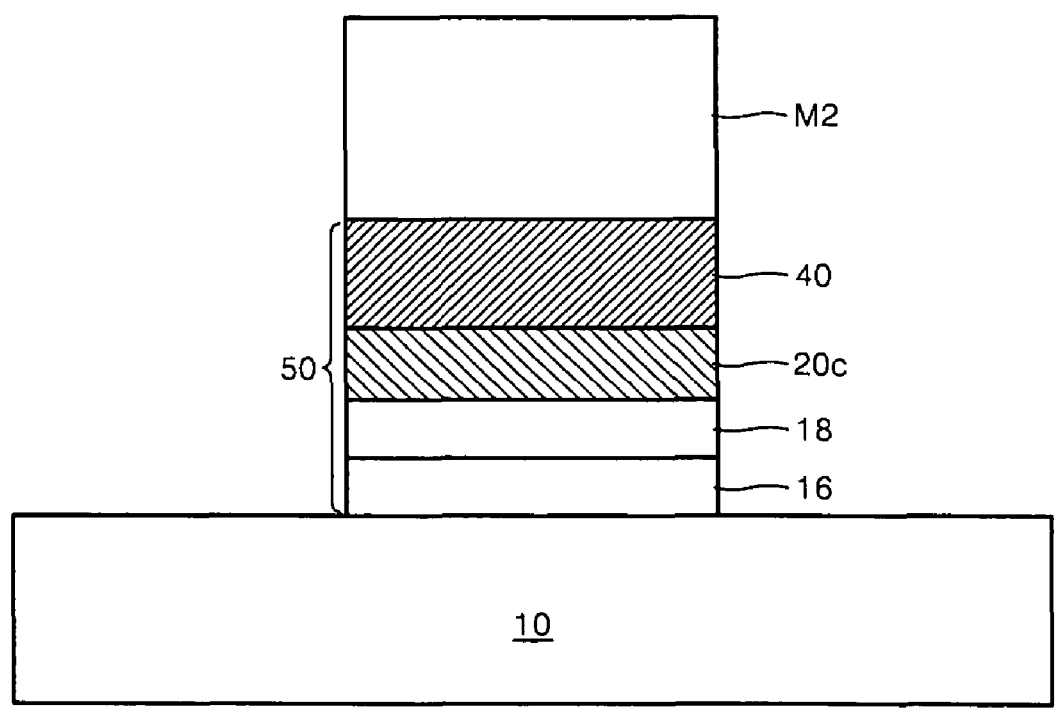

Referring to FIG. 18, a mask M2 may be formed on the crystalline aluminum oxide layer 20C. The mask may define a gate region. The metal layer 40, the crystalline aluminum oxide layer 20C, a charge trap layer 18, and a tunneling film 16, which formed around the mask M2, may be sequentially etched. The etching process may be performed until the substrate 10 is exposed. FIG. 19 illustrates the resultant structure after performing the etching process. The mask M2 may then be removed. A gate stack 50 may be formed on the substrate 10 by the etching process.

Figure 20:
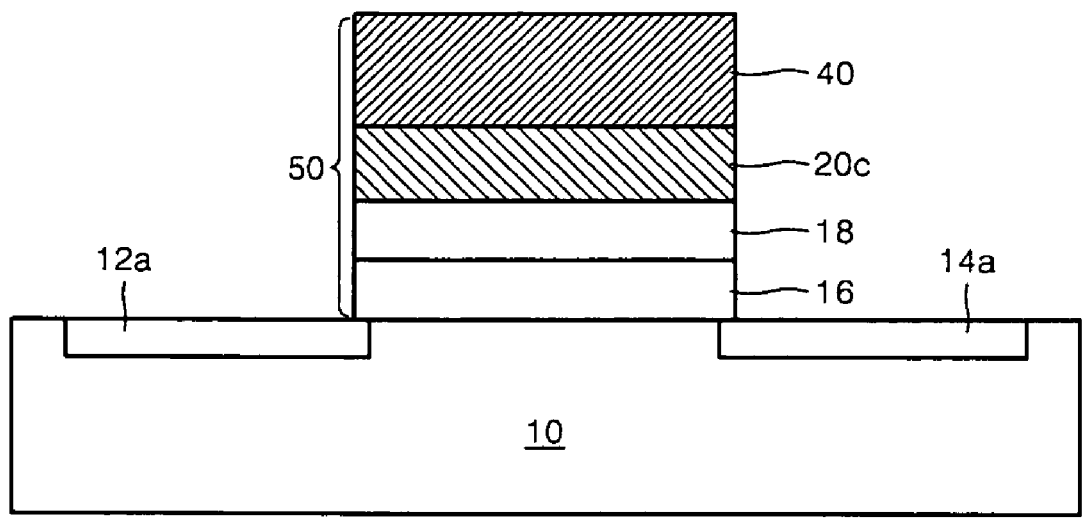
Figure 21:
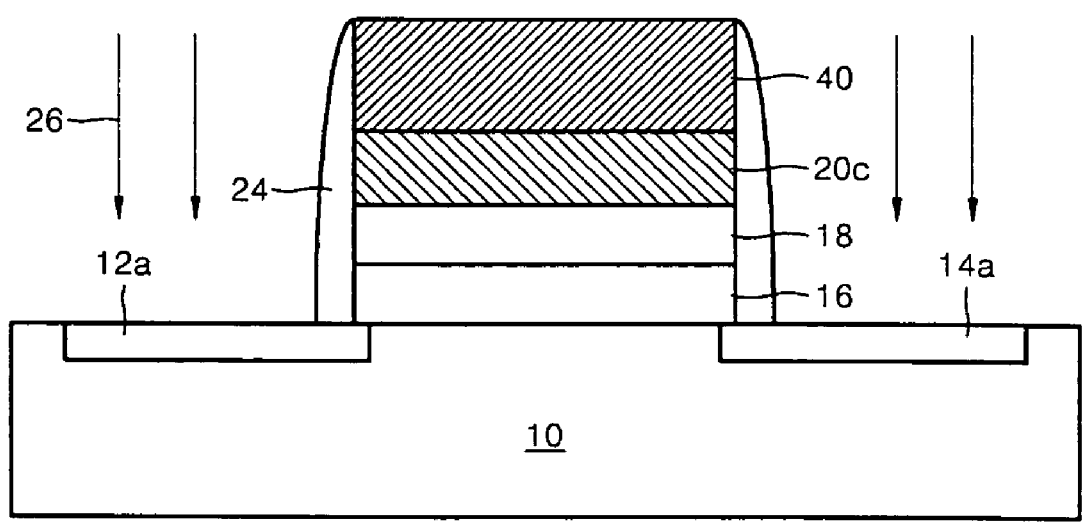

Referring to FIG. 20, first and second shallow impurity regions 12a and 14a may be formed on the substrate 10. As shown in FIG. 21, a gate spacer 24 covering side surfaces of the gate stack 50 may be formed, and first and second impurity regions 12 and 14 may be formed by injecting conductive impurities 26 into the first and second shallow impurity regions 12a and 14a. One of the first and second impurity regions 12 and 14 may serve as a source region, whereas the other may serve as a drain region.

Figure 22:
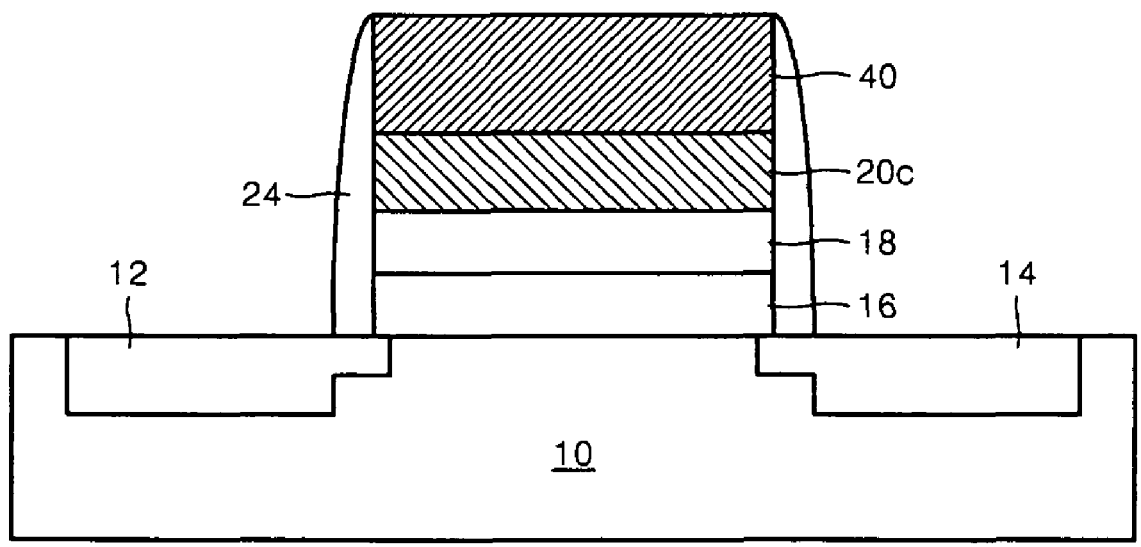

FIG. 22 illustrates an example embodiment of a charge trap memory device formed by the above process.

The processes illustrated in FIGS. 20 through 22 may be the same as the process shown in FIGS. 7 through 9.

In example embodiments of methods of manufacturing a charge trap memory device, a separate process for removing a material layer used to form the α-phase crystalline aluminum oxide layer 20C after the α-phase crystalline aluminum oxide layer 20C is formed may be omitted. Accordingly, the manufacturing process may be simplified relative to the conventional art.

In manufacturing methods according to example embodiments, when the metal layer 40 is a $Rh_2O_3$ layer, a phase of the metal layer 40 may change from a conductive phase to an insulating phase, or vice-versa. Because the metal layer 40 is used as a gate electrode, the phase of the metal layer 40 in the final resultant structure may be a conductive phase.

Therefore, when the metal layer 40 is a $Rh_2O_3$ layer—for example, after the thermal treatment described with reference to FIG. 16 (hereinafter, a first thermal treatment) is performed on the metal layer 40 in the insulating phase—a second thermal treatment may be performed on the metal layer 40 to change the phase of the metal layer 40 to a conductive phase. The second thermal treatment may be performed at normal pressure in a temperature range of between about 1000° C. and 1300° C., inclusive. The second thermal treatment may be performed using a rapid thermal annealing (RTA) or similar method.

The first thermal treatment may be performed after completing the etching process using the mask M2. For example, the first thermal treatment may be performed after the resultant structure of FIG. 19 is obtained. In this example, the first thermal treatment may be performed in a state where the mask M2 exists, or performed after removing the mask M2.

Although example embodiments are described herein with regard to implanting H or OH into the amorphous aluminum oxide layer. It will be understood that H and/or OH may be implanted into the amorphous aluminum oxide layer. Moreover, example embodiments should not be limited to aluminum oxide material layers. To the contrary, example embodiments may be implemented and/or utilized in connection with metal oxide layers having similar properties and/or uses.

While the present invention has been particularly shown and described with reference to example embodiments thereof, it will be understood by one of ordinary skill in the art that various changes in form and details may be made therein without departing from the spirit and scope of the present invention as defined by the following claims.

What is claimed is:

1. A method of increasing an energy band gap of an aluminum oxide layer, comprising:
    forming an amorphous aluminum oxide layer on a lower film;
    introducing hydrogen (H) or hydroxyl group (OH) into the amorphous aluminum oxide layer; and
    crystallizing the amorphous aluminum oxide layer including the H or OH.

2. The method of claim 1, wherein the H or OH is introduced in the amorphous aluminum oxide layer using one of a wet oxidation method, an ion implantation method, and a plasma doping method.

3. The method of claim 2, wherein the wet oxidation is performed at atmospheric pressure and a first temperature, or at a pressure higher than the atmospheric pressure and a second temperature, which is lower than the first temperature.

4. The method of claim 1, wherein the crystallizing of the amorphous aluminum oxide layer includes,
    performing a first thermal treatment on the amorphous aluminum oxide layer, the first thermal treatment being performed in a temperature range of about 800° C. to about 1300° C., inclusive.

5. The method of claim 4, further including,
    performing a second thermal treatment on the amorphous aluminum oxide layer, the second thermal treatment being performed at a temperature lower than a crystallization temperature of the amorphous aluminum oxide layer.

6. The method of claim 1, wherein the forming of the amorphous aluminum oxide layer on the lower film and the introducing of the H or OH in the amorphous aluminum oxide layer are performed during a single process.

7. The method of claim 1, wherein the amorphous aluminum oxide layer is crystallized while introducing the H or OH.

8. The method of claim 7, wherein the amorphous aluminum oxide layer is formed using a vapor deposition method or an atomic layer deposition (ALD) method.

9. The method of claim 1, wherein the crystallized aluminum oxide layer includes a crystal phase of which an energy band gap is greater than 7.0 eV.

10. A method of manufacturing a charge trap memory device, the method comprising:
 forming an aluminum oxide layer in accordance with the method of claim 1, wherein the lower film is a charge trap layer.

11. The method of claim 10, wherein the crystallized aluminum oxide layer includes a crystal phase of which an energy band gap is greater than 7.0 eV.

12. The method of claim 10, wherein the H or OH is introduced in the amorphous aluminum oxide layer using one of a wet oxidation method, an ion implantation method, and a plasma doping method.

13. The method of claim 12, wherein the wet oxidation is performed at atmospheric pressure and a first temperature, or at a pressure higher than the atmospheric pressure and a second temperature, which is lower than the first temperature.

14. The method of claim 10, wherein the crystallizing of the amorphous aluminum oxide layer includes,
 performing a first thermal treatment on the amorphous aluminum oxide layer, the first thermal treatment being performed in a temperature range of about 800° C. to about 1300° C., inclusive.

15. The method of claim 14, further including,
 performing a second thermal treatment on the amorphous aluminum oxide layer, the second thermal treatment being performed at a temperature lower than a crystallization temperature of the amorphous aluminum oxide layer.

16. The method of claim 10, wherein after H or OH is introduced, the method further includes,
 densifying the amorphous aluminum oxide layer including H or OH before the crystallizing of the amorphous aluminum oxide layer.

17. The method of claim 10, wherein the introducing of H or OH in the amorphous aluminum oxide layer further includes,
 performing a first thermal treatment on the amorphous aluminum oxide layer in an oxygen atmosphere when introducing H or OH.

18. The method of claim 10, wherein H is introduced after the amorphous aluminum oxide layer is formed on the charge trap layer in an oxygen-rich state.

19. The method of claim 18, further including,
 densifying the amorphous aluminum oxide layer including H.

20. The method of claim 10, wherein the charge trap layer is a silicon nitride layer.

21. A method of manufacturing a charge trap memory device including a gate stack formed of a tunneling film, a charge trap layer, an α-phase crystalline aluminum oxide layer, and a gate electrode stacked sequentially on a substrate, the method comprising:
 forming an amorphous aluminum oxide layer on the charge trap layer;
 forming a metal layer on the amorphous aluminum oxide layer, the metal layer having a space lattice similar to that of the α-phase crystalline aluminum oxide layer; and
 changing the amorphous aluminum oxide layer to the α-phase crystalline aluminum oxide layer by performing a thermal treatment on a resultant including the metal layer.

22. The method of claim 21, wherein the changing the amorphous aluminum oxide layer to the α-phase crystalline aluminum oxide layer further includes,
 forming a mask on the metal layer, the mask defining a region where the gate stack is to be formed,
 sequentially etching the metal layer, the amorphous aluminum oxide layer, the charge trap layer, and the tunneling film, which are formed around the mask, and
 performing a thermal treatment on the resultant including the metal layer.

23. The method of claim 21, wherein after the changing of the amorphous aluminum oxide layer to the α-phase crystalline aluminum oxide layer, the method further comprises:
 forming a mask on the metal layer, the mask defining a region where the gate stack is to be formed;
 sequentially etching the metal layer, the α-phase crystalline aluminum oxide layer, the charge trap layer, and the tunneling film, which are formed around the mask; and
 removing the mask.

24. The method of claim 23, wherein, after the mask is removed, the thermal treatment is performed on the resultant including the metal layer.

25. The method of claim 21, wherein the metal layer is formed of one of a TiCN layer, a Ru layer of which a crystal direction is (0001), and a $Rh_2O_3$ layer.

26. The method of claim 25, further comprising:
 performing a thermal treatment for changing the metal layer to a conductive layer when the metal layer is a $Rh_2O_3$ layer.

27. The method of claim 21, wherein the thermal treatment is performed at normal pressure in a temperature range of between about 1000° C. to about 1300° C., inclusive.

* * * * *